US006642780B2

United States Patent
Isoda

(10) Patent No.: US 6,642,780 B2
(45) Date of Patent: Nov. 4, 2003

(54) VARIABLE FREQUENCY FILTER CIRCUIT

(75) Inventor: Hiroshi Isoda, Ikoma-gun (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 10/162,179

(22) Filed: Jun. 5, 2002

(65) Prior Publication Data

US 2003/0048130 A1 Mar. 13, 2003

(30) Foreign Application Priority Data

Jun. 12, 2001 (JP) ........................................ 2001-177683

(51) Int. Cl.[7] .............................. H03B 1/00; H03K 5/00; H04B 1/00
(52) U.S. Cl. ....................................... 327/553; 327/558
(58) Field of Search .............................. 327/552–555, 327/558; 330/315

(56) References Cited

U.S. PATENT DOCUMENTS

| | | | | | |
|---|---|---|---|---|---|
| 5,182,478 | A | * | 1/1993 | Nomura | 327/553 |
| 5,396,188 | A | * | 3/1995 | Aoki | 327/552 |
| 5,914,633 | A | * | 6/1999 | Comino et al. | 327/553 |
| 6,369,644 | B1 | * | 4/2002 | Yoshizawa | 327/553 |

FOREIGN PATENT DOCUMENTS

JP 05-114834 5/1993

* cited by examiner

Primary Examiner—Terry D. Cunningham
Assistant Examiner—Quan Tra
(74) Attorney, Agent, or Firm—Harness, Dickey & Pierce P.L.C.

(57) ABSTRACT

A variable frequency filter circuit, provided with a low pass filter constituted of a gm amplifier, is a low pass filter circuit in which a micro controller controls a current value converting circuit so as to adjust a reference current of the low pass filter in order to adjust a cut-off frequency. When the variable frequency filter circuit is in an adjusting mode, the variable frequency filter circuit detects a shift in a cut-off frequency of the low pass filter for filtering an actual signal. As to a dynamic change in a power supply voltage, ambient temperature or the like, which cannot be detected in real time, a value of the shift can be worked out in advance and with accuracy via simulation. Therefore, the shift is compensated in accordance with the value stored in a data memory. This requires no need of an arrangement to have a separate reference filter for detecting a shift for compensation of the shift, thereby eliminating an influence the arrangement. Therefore, this suppresses influence due to relative unevenness of circuit elements as to circuit layouts, reduces electrical consumption, and prevents an interference signal from reaching to a received signal.

12 Claims, 15 Drawing Sheets

VARIABLE FREQUENCY FILTER CIRCUIT

FIELD OF THE INVENTION

The present invention relates to a variable frequency filter circuit for use, suitably as a base band LPF circuit, in an RF front-end section of a digital satellite broadcasting receiver of a direct conversion type, in which a received high-frequency signal is directly demodulated into a base band signal.

BACKGROUND OF THE INVENTION

In case an above-described digital satellite-broadcasting receiver is realized adopting a direct conversion method, it is necessary for a base band LPF (Low Pass Filter) to have a band sufficient for passing a data rate of a received signal, because an output from mixer is directly separated into desired quadrature modulation signals I and Q. On the other hand, as a band of a broadcasting signal is compressed while receiving channels are increased in number, it becomes more important to have a higher interference characteristic against an adjacent signal. In view of this, higher cut-off frequency accuracy ensures an amount of attenuation against adjacent channel interference, thereby improving reception quality (bit error rate). For this reason, the base band LPF circuit needs to accurately adjust a cut-off frequency in order to attenuate the adjacent signal by a sufficient amount within a most suitable bandwidth according to the data rate of the received signal.

FIG. 10 is a block diagram illustrating an electrical arrangement of a typical conventional LPF circuit 1 which is such a cut-off frequency variable LPF circuit realized on an integrated circuit. The LPF circuit 1 is a tertiary LPF. A base band signal from mixer, which is inputted from an input terminal 2, is outputted from an output terminal 3 after passing through an LPF F1 and an LPF F2 connected in series. The LPF F1 has primary cut-off frequency characteristics, whereas the LPF F2 has secondary cut-off frequency characteristics. For example as shown in FIG. 11, the LPF F1 is composed of a gm amplifier A1, and the LPF F2 is composed of gm amplifiers A21 and A22 (hereinafter, the reference mark A is used to refer to all of them), and the LPF F1 is provided with capacitor C1, and the LPF F2 is provided with capacitors C21 and C22. The capacitors C1, C21, and C22 are for determining Q in connection with the respective gm amplifiers A1, A21, and A22.

Each of the gm amplifiers A is, as shown in FIG. 12, can be described as a circuit that is provided with a power supply 11, constant current sources 12 to 15, transistors Q1 to Q6, and an emitter resistance RE.

The power supply 11 steps down a power supply voltage Vcc by a predetermined voltage. The transistor Q1, arranged as a diode with its collector connected with its base, supplies a constant current from the power supply 11. A collector of the transistor Q2 receives an emitter current of the transistor Q1. A base of the transistor Q2 functions as a normal input IN. The transistor Q2 receives a base band signal from the normal Input IN via an input terminal 2. The constant current source 12 pulls out a constant current $I_A$ from an emitter of the transistor Q2. The transistors Q1 and Q2, and the constant current source 12 constitute a series circuit.

The transistor Q3, arranged as a diode by connecting its collector with its base, supplies a constant current from the power supply 11. A collector of the transistor Q4 receives an emitter current of the transistor Q3. A base of transistor Q4 functions as an inverting input XIN. A later-described output signal OUT is negatively fed back the inverting input XIN. The constant current source pulls out a constant current $I_A$ from an emitter of the transistor Q4. The transistors Q3 and Q4, and the constant current source 13 constitute a series circuit similar to the above-described series circuit.

The emitter resistance RE is a resistance that connects the emitter of the transistor Q2 and the emitter of the transistor Q4. Bases of the transistors Q5 and Q6 in pair respectively receive collector voltages of the transistors Q2 and Q4. The output voltage OUT is derived from a collector of the transistor Q5, and negatively fed back into the base of the transistor Q4. The constant current source 14 pulls out a constant current $I_B$ mutually from emitters of the transistors Q5 and Q6. The constant current source 15 supplies a constant current $I_B/2$ to the collector of the transistor Q5.

Gains, gms, of the gm amplifiers A having the above arrangement can be represented by the following equation:

$$gm = \frac{1}{\left\{\left(RE + \frac{2 \cdot Vt}{I_A}\right) \cdot \left(\frac{I_B}{2 \cdot I_A}\right)\right\}}, Vt = \frac{kT}{q} \quad (1)$$

where $I_A$ and $I_B$ are current values of the constant rent sources, RE is an emitter resistance value, k is the Boltzmann's constant ($1.38 \times 10^{-23}$), T is an absolute temperature (K), and q is an electrical charge of one electron ($1.6 \times 10^{-19}$).

Cut-off frequencies ω1 and ω2 of the LPFs F1 and F2 using the gm amplifiers A are represented as follows:

$$\omega 1 = \frac{gm1}{C1} \quad (2)$$

$$\omega 2 = \sqrt{\frac{gm21 \cdot gm22}{C21 \cdot C22}} \quad (3)$$

where gm1 is a gm of the am amplifier A1, gm 21 is a gm of the gm amplifier A21, and gm 22 is a gm of the gm amplifier A22.

Here, the cut-off frequency ω1 of the LPF F1 is in proportion with the gm 1, and the cut-off frequency ω2 of the LPF F2 is in proportion with gm 21 and gm 22. Meanwhile, the gm 1, the gm 21, and the gm 22 are in proportion with $1/I_B$. Therefore, when a value of the constant current $I_B$ is halved, the cut-off frequencies ω1 and ω2 are doubled. Thus, accurate control of the constant current $I_B$ enables accurate adjustment (varying) of the cut-off frequencies ω1 and ω2. In response to cut-off frequency selection signals S1 and S2 inputted into a signal input terminal 4, the value of the constant current $I_B$ is controlled by current value converting circuits B1 and B2 provided respectively in the LPF F1 and LPF F2. The current value converting circuits B1 and B2 respectively control the constant current $I_B$ as reference currents IB1 and IB2.

The LPF circuit 1 shown in FIG. 10 is provided with a reference LPF F2a (an LPF F2a for reference), an input amplifier 5, a phase comparator 6, a high gain voltage amplifier 7, a voltage-current converting circuit 8, and constant current sources 9 and 10, in order to control the value of the constant current $I_B$ accurately.

The input amplifier 5 adjusts a level of a reference frequency signal ω0 inputted from an input terminal 2a. The phase comparator 6 detects a phase difference between (1) the reference frequency signal ω0 whose level has been adjusted by the input amplifier 5, and (2) an output signal of the LPF F2a. The high gain voltage amplifier 7 amplifies the compared output signal, thereby ensuring sensitivity for the phase difference around 90°. The voltage-current converting circuit 8 converts, into a current value, a voltage value that is outputted from the high gain voltage amplifier 7, then extracts the current value as a reference current I0 for a current mirror circuit. The constant current sources 9 and 10 respectively generate constant currents IB2a and IB12 in accordance with the reference current I0, and supply the constant currents IB2a and IB12 to the reference LPF F2a and the current value converting circuits B1 and B2.

The reference LPF F2a is a secondary LPF identical to the secondary LPF F2, which is an LPF of a main body, in terms of a circuit arrangement and a circuit element constant, so as to take an advantage of having, as shown in FIG. 13, a 90° phage difference between the input signal and the output signal for the cut-off frequency $\omega 0$ at which a frequency property is dropped by −3 dB, thereby avoiding unevenness in absolute output values with respect to a relationship between (a) an input phase difference for the phase comparator 6 and (b) a compared output. Further, as shown in FIG. 14, when the phase difference is 90°, the output voltage of the high gain voltage amplifier 7, which amplifies an output level of the phase comparator 6, is 0V. Thus, in a vicinity of 90°, the output voltage is largely varied in response to a slight change in the phase difference. In other words, the high gain voltage amplifier 7 operates with a high gain.

Put as a reference is the reference current I0 acquired by performing the voltage-current conversion of the output signal level of the high gain voltage amplifier 7 by the voltage-current converting circuit 8. Having the reference current I0 as the reference, the constant current value IB2a, which is generated by the current mirror circuit built in the constant current source 9, is supplied to the reference LPF F2a. In this way, the phase difference of the input/output signals of the reference LPF F2a is controlled so as to be 90°, in other words, so that the output signal level of the high gain voltage amplifier 7 will be 0V. As a result, the cut-off frequency $\omega 2a$ of the reference LPF F2a is adjusted to a frequency of the reference frequency signal $\omega 0$.

Having the reference current I0 as reference, the constant current source 10 outputs the constant current IB12 for generation of the reference currents IB1 and IB2 that are for adjusting the cut-off frequencies of the LPFs F1 and F2. In case the cut-off frequencies $\omega 1$ and $\omega 2$ of the LPFs F1 and F2 are to be adjusted to desired frequencies, the frequency of the reference frequency signal $\omega 0$ is directly changed so as to adjust the cut-off frequencies $\omega 1$ and $\omega 2$ to the desired frequencies. However, there is a possibility that a fundamental wave and a higher harmonic wave of the reference frequency $\omega 0$ may interfere the base band signal. Therefore, the reference current IB1 of the gm amplifier A1, and the reference current IB2 of the gm amplifiers A21 and A22 are generated, in accordance with the constant current IB12, by the current value converting circuits B1 and B2 constituted of current mirror circuits as shown in FIG. 15. The reference current IB1 and the constant IB12 determine the cut-off frequencies.

The current value converting circuits B1 and B2 are provided with four transistors Q11 to Q14, switches SW1 to SW4, and a current source control circuit 16.

The transistors Q11 to Q14 are positioned in parallel to each other in such a manner that elements of the transistors Q11 to Q14 are in a ratio of 1:2:4:8 in terms of numbers, the elements being of the same characteristics. Bases of the transistors Q11 to Q14 mutually receive the constant current IB12, and collectors of the transistor Q11 to Q14, which are connected to each other, output the reference currents IB1 and IB2.

The switches SW1 to SW4 connect emitters of the transistors Q11 to Q14 respectively to GND. The current source control circuit 16 performs ON/OFF control of the respective switches SW1 to SW4.

The current source control circuit 16 selectively turns one of the switches SW1 to SW4, in response to cut-off frequency selection signals S1 and S2 in two bits, which is inputted to the input terminal 4. Thereby, the current source control circuit 16 can vary the reference currents IB1 and IB2 to two, four, and eight times of a current flowing through the transistor Q11. A value of the constant current IB12 of the constant current source 10 is so set that the reference current IB2 of the current value converting circuit B2 will be at the same value as the reference current IB2a of the reference LPF F2a when the transistor Q14 is turned ON. In this way, as shown in Table 1, realized is the LPF circuit 1 capable of selecting four (4) kinds of cut-off frequencies $\omega 1$ and $\omega 2$ by switching over the cut-off frequencies selection signals S1 and S2 in accordance with the received signal.

TABLE 1

| SS S1 Level | SS S2 Level | SW1 | SW2 | SW3 | SW4 | CVofCCS | CF F |
|---|---|---|---|---|---|---|---|
| GND | GND | OFF | OFF | OFF | ON | $I_B$ | $\omega 1, \omega 2$ |
| GND | Vcc | OFF | OFF | ON | ON | $I_B/2$ | $2\omega 1, 2\omega 2$ |
| Vcc | GND | OFF | ON | OFF | OFF | $I_B/4$ | $4\omega 1, 4\omega 2$ |
| Vcc | Vcc | ON | OFF | OFF | OFF | $I_B/8$ | $8\omega 1, 8\omega 2$ |

Abbreviation:
SS S1 Level = Selection Signal S1 Level
SS S2 Level = Selection Signal S2 Level
CVofCCS = Current Value of Constant Current Source
CF F = Cut-Off Frequency Furthermore, the reference frequencies $\omega 0$ for determining the cut-off frequencies $\omega 1$ and $\omega 2$ is adjusted by varying a ratio between the current values IB2a and IB12 outputted respectively from the constant current sources 9 and 10. Thus, the a range of the adjustment and a setting of the adjustment as to stages can be adjusted by incorporating the current value converting circuits B1 and B2 with this arrangement.

The LPF circuit 1 having the above arrangement is so adopted that the thus set cut-off frequencies can be adjusted by the current value converting circuits B1 and B2 in response to such influence given by a power supply voltage, ambient temperatures, or unevenness as to circuit layouts, so that the accuracy of the cut-off frequency selection signals S1 and S2 can be maintained even though there is such influence. Moreover, because the LPFs F1 and F2 operate all the time, such adjustment of the cut-off frequencies is carried out by using the reference LPF F2a or the like that has the same characteristics as the LPFs F1 and F2 of the main body, so as not to retard a flow of the base band signal.

Then, the reference LPF F2a receives, instead of the received base band signal, the reference frequency signal $\omega 0$ whose frequency is highly accurate. The cut-off frequency selection signals S1 and S2 are adjusted so that the phase difference between that reference frequency signal $\omega 0$ and the output signal of the reference LPF F2a will be constant. Because of this, the reference LPF F2a has a cut-off frequency that is highly accurate almost as that of the reference frequency signal $\omega 0$, thereby ensuring that the reference LPF F2a is highly accurate.

This arrangement has no problem as long as the LPFs F1 and F2 of the main body, and the reference LPF F2a have perfectly identical characteristics. However, there are two types of causes for unevenness in elemental characteristics of integrated circuits, namely, (1) characteristic variations (absolute unevenness) between a plurality of the integrated circuits formed on a semiconductor wafer, and (2) characteristic variations (relative unevenness) due to the circuit layouts which are caused, even in one integrated circuit, because of a location in which the circuit element is mounted, a direction in which the circuit element is positioned, or the like cause. The absolute unevenness, the former, can be avoided in the conventional adjusting method by having an identical circuit arrangement and constant elemental number for the LPFs F1 and F2 of the main body, and the reference LPF F2a. However, the conventional adjusting method has such a problem that the relative unevenness, the later, cannot be avoided in the conventional adjusting method, because the two LPFs F1 and F2, and the LPF F2a are independent of each other.

Specifically, an effect of the relative unevenness can be diminished by having a special circuit layout. For example, regarding the resistance, the circuit layout may be so arranged that the resistance is constituted of a plurality of the resistance elements connected in series-parallel, instead of using one resistance element to achieve the desired value of the resistance. However, it is quite disadvantageous in terms of area to have such circuit layout in which the relative unevenness among the LPFs F1 and F2, and the reference LPF F2a is considered, in addition to the arrangement in which the two LPFs, namely the LPFs F1 and F2 are provided in the main body for the I signal and for the Q signal, with an extra circuit, namely the reference LPF F2a, provided therewith.

Furthermore, in the adjusting method of the cut-off frequency, the arrangement for adjusting the reference LPF F2a and the like operates all the time during the reception of the satellite broadcasting, regardless whether the cause of the variations, such as the power supply voltage or the ambient temperatures, is present or absent. Because of this, it is necessary to have consideration in terms of the circuit arrangement and wiring, lest the reference frequency signal $\omega 0$, which has the same frequency band and the received signal, bypasses the reference LPF F2a and reaches to the base band amplifier of a next stage. It is a problem that this affects a layout of the whole integrated circuit.

SUMMARY OF THE INVENTION

The present invention has an object of providing a variable frequency filter circuit capable of suppressing an effect caused by an arrangement for adjusting a cut-off frequency.

A variable frequency filter circuit of the present invention, in order to attain the above object, is provided with (1) a filter for adjusting a cut-off frequency, (2) an adjusting section for arbitrarily setting the cut-off frequency of the filter in accordance with a variable setting value so at to adjust the cut-off frequency, (3) a first recording section for storing therein a first compensating value for compensating the setting value, the first compensating value being worked out in advance via simulation in order to compensate circuit characteristics that dynamically vary depending on usage, (4) a reference signal source for generating a reference frequency signal, (5) an input switching section, provided in an input stage of the filter, for inputting, to the filter, the reference frequency signal instead of an input signal, during an adjusting mode period during which the adjusting section adjusts the cut-off frequency, (6) a control section for adjusting the setting value so that an output from the filter with respect to the reference frequency signal will have a predetermined value, and for outputting the setting value, and (7) a second recording section for storing the adjusted setting value as a second compensating value, wherein during a regular operation mode period the control section compensates a shift in the cut-off frequency due to a change in the circuit characteristics by compensating the setting value with the first compensating value stored in the first recording section, and compensates a shift in the cut-off frequency due to a circuit layout by compensating the second compensating value stored in the second recording section.

With the above arrangement, where the adjusting mode is provided, the shift of the cut-off frequency is detected and compensated by using the filter for filtering an actual signal. Compared with an arrangement where a reference filter and the like are specially provided for detecting and compensating the shift, the above arrangement suppresses an influence due to relative unevenness of circuit elements as to circuit layouts. Moreover, for a variable frequency filter circuit adopted to suppress the influence given by the arrangement for adjusting the cut-off frequency, such as reduction of current consumed and preventing an interface signal from reaching to a receiving signal, the above arrangement makes it possible to work out, in advance and with accuracy, a shift of the cut-off frequency due to a dynamic change in circuit characteristics of the filter, which is caused by a change in a power supply voltage or an ambient temperature, for example, and which cannot be detected without a special arrangement for detecting the shift of the cut-off frequency. Therefore, a compensating value for compensating the shift is stored in the first recording section as the first compensating value. The setting value previously mentioned can be compensated in accordance with the first compensating value corresponding to the power supply voltage or the ambient temperature actually detected, and the second compensating value corresponding to relative unevenness that is a constant value even though each circuit element has different relative unevenness. Thereby, a shift due to the relative unevenness in the cut-off frequency can be compensated.

This eliminates an influence given by the arrangement for adjusting the cut-off frequency, requires no special consideration for circuit layout and wiring, and reduces time for layout.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 to 3 and FIGS. 11, 13 to 15 discussed previously, an embodiment of the present invention is explained below.

Figure 1:
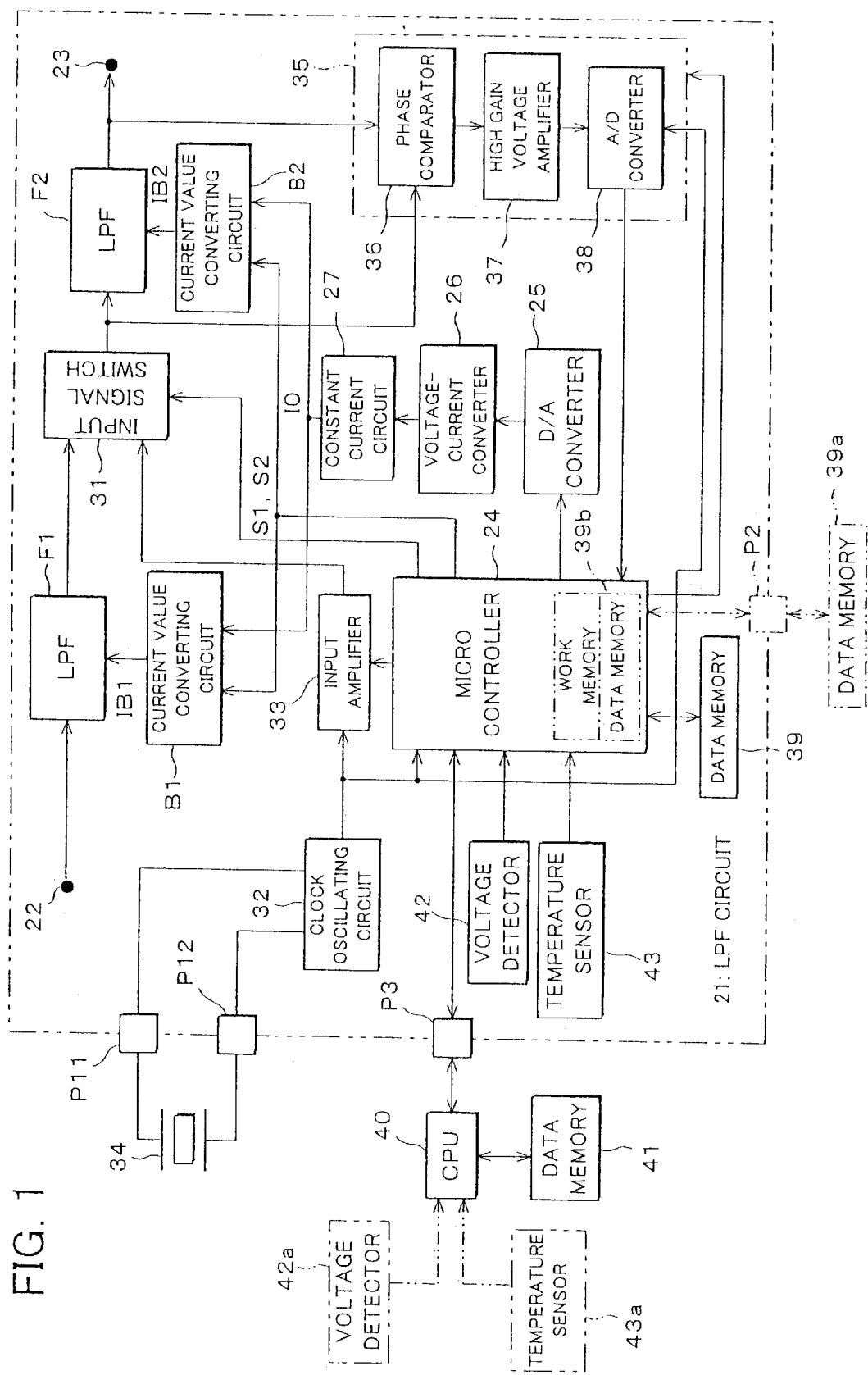
FIG. 1 is a block diagram illustrating an electrical arrangement of an LPF circuit of an embodiment of the present invention.

FIG. 1 is a block diagram illustrating an electrical arrangement of an LPF circuit 21 of the embodiment of the present invention. The LPF circuit 21, which is used as a base band LPF circuit in an RF front-end section of a set top box for reception of the digital satellite broadcasting of the direct conversion type, is a tertiary LPF in which a cut-off frequency variable LPF circuit is realized on an integrated circuit. Therefore, the LPF circuit 21 actually has two filters (filters of double systems); one for an I signal and the other for a Q signal, even though only one filter is illustrated in FIG. 1 (the filter of FIG. 1 is illustrated to be of signal system) for the sake of simplification of FIG. 1.

The base band signal, which is inputted from a mixer (not shown) into an input terminal 22, is outputted from an output terminal 23 after passing LPFs F1 and F2 connected in series. The mixer is a preceding circuit with respect to the LPF circuit 21 in the integrated circuit. The LPF F1 has primary cut-off frequency characteristics, while the LPF F2 has secondary cut-off frequency characteristics. For example, the LPF F1 is provided with a gm amplifier A1 and a capacitor C1 shown in FIG. 1, whereas the LPF F2 is provided with gm amplifiers A21 and A22, and capacitors C21 and C22 shown in FIG. 1. Cut-off frequencies ω1 and ω2 of the LPFs F1 and F2 are varied in proportion with reference currents IB1 and IB2 supplied from current value converting circuits B1 and B2 provided respectively in the LPFs F1 and F2.

Figure 15:
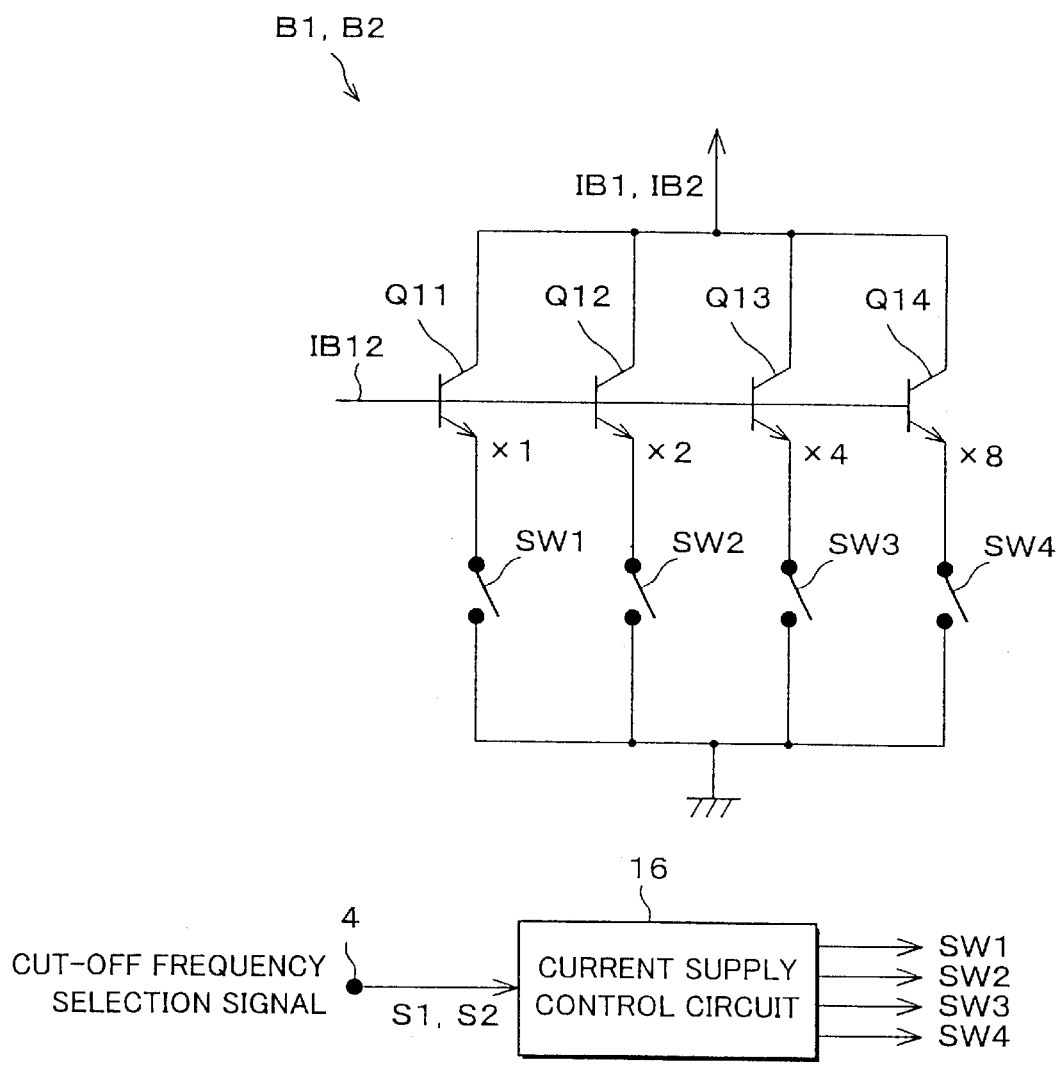
FIG. 15 is a block diagram specifically showing an arrangement of a current value converting circuit that controls frequencies of the LPF of FIG. 10 and the LPFs of the embodiments of the present invention.

The current value converting circuits B1 and B2 are, for example, constituted as shown in FIG. 15 discussed previously. Moreover, reference currents IB1 and IB2 to be outputted from the current value converting circuits B1 and B2 are generated in the following manner.

To begin with, a micro controller 24 outputs a digital value that corresponds to a later described reference current I0. The digital value is converted into an analog value by a D/A converter 25 and a voltage-current converting circuit 26. A constant current circuit 27 generates the reference current I0 in accordance with a current outputted from the voltage-current converting circuit 26. Then, the reference current I0 is used as a reference current for a current mirror circuit constituted of transistors Q11 to Q14 previously discussed.

On the other hand, a previously described current source controlling circuit 16 selectively turns ON one of previously discussed switches SW1 to SW4 in the current value converting circuits B1 and B2, in response to cut-off frequency section signals S1 and S2 in two bits that correspond to the desired cut-off frequencies ω1 and ω2, the cut-off frequency section signals S1 and S2 being outputted by the micro controller 24. As a result, the reference currents IB1 and IB2 are generated. Moreover, in accordance with ambient temperatures, power supply voltages, and unevenness as to circuit layouts, the micro controller 24 subtly adjusts the digital value that corresponds to the reference current I0 that is a setting value for setting the cut-off frequencies, as later described.

It should be noted that, in the present embodiment, the LPF circuit 21 has (a) a regular operation mode for regular reception operation, and (b) an adjusting mode for adjusting, in accordance with a reference frequency signal, the cut-off frequencies in regard to the unevenness as to the circuit layouts. For this reason, an input switching circuit 31 is provided between the LPF F1 and LPF F2.

In response to a switching signal outputted by the micro controller 24, when the LPF circuit 21 is in the regular operation mode (hereinafter, a period in which an LPF circuit (in this embodiment, the LPF circuit 21) is in the regular operation mode is referred to as a regular operation mode period), the input switching circuit 31 inputs, into the LPF F2, the base band signal outputted from the LPF F1 that precedes to the input switching circuit 31, whereas the input switching circuit 31 inputs the reference frequency signal into the LPF F2 when the LPF circuit 21 is in the adjusting mode (hereinafter, a period in which an LPF circuit (in this embodiment, the LPF circuit 21) is in the adjusting mode is referred to as an adjusting mode period). The reference frequency signal is generated by adjusting a clock signal by means of an input amplifier 33 to a specified input level of the LPF F2, specified for the adjusting mode. The clock signal has a logic amplitude level generated by a clock oscillating circuit 32.

The clock oscillating circuit 32 is connected to an externally provided oscillator 34 via communication terminals P11 and P12. The clock signal having the logic amplitude level generated by the clock oscillating circuit 32 is supplied to the micro controller 24 and the like, as a clock signal. The micro controller 24 controls the whole system.

Moreover, in the present embodiment, provided is a block 35 that is controlled by the micro controller 24 so as to operate only when the LPF circuit 21 is in the adjusting mode. The block 35 is provided with a phase comparator 36, a high gain voltage amplifier 37, and an A/D converter 38. The phase comparator 36 detects a phase difference between an input signal and an output signal into/from the LPF F2. The high gain voltage amplifier 37 amplifies a detected voltage of an output of the phase comparator 36 in a vicinity of 90° phase difference, thereby improving sensitivity in the detection. The A/D converter 38 converts thus amplified output voltage signal into a digital value in timing of the clock signal.

Figure 13:
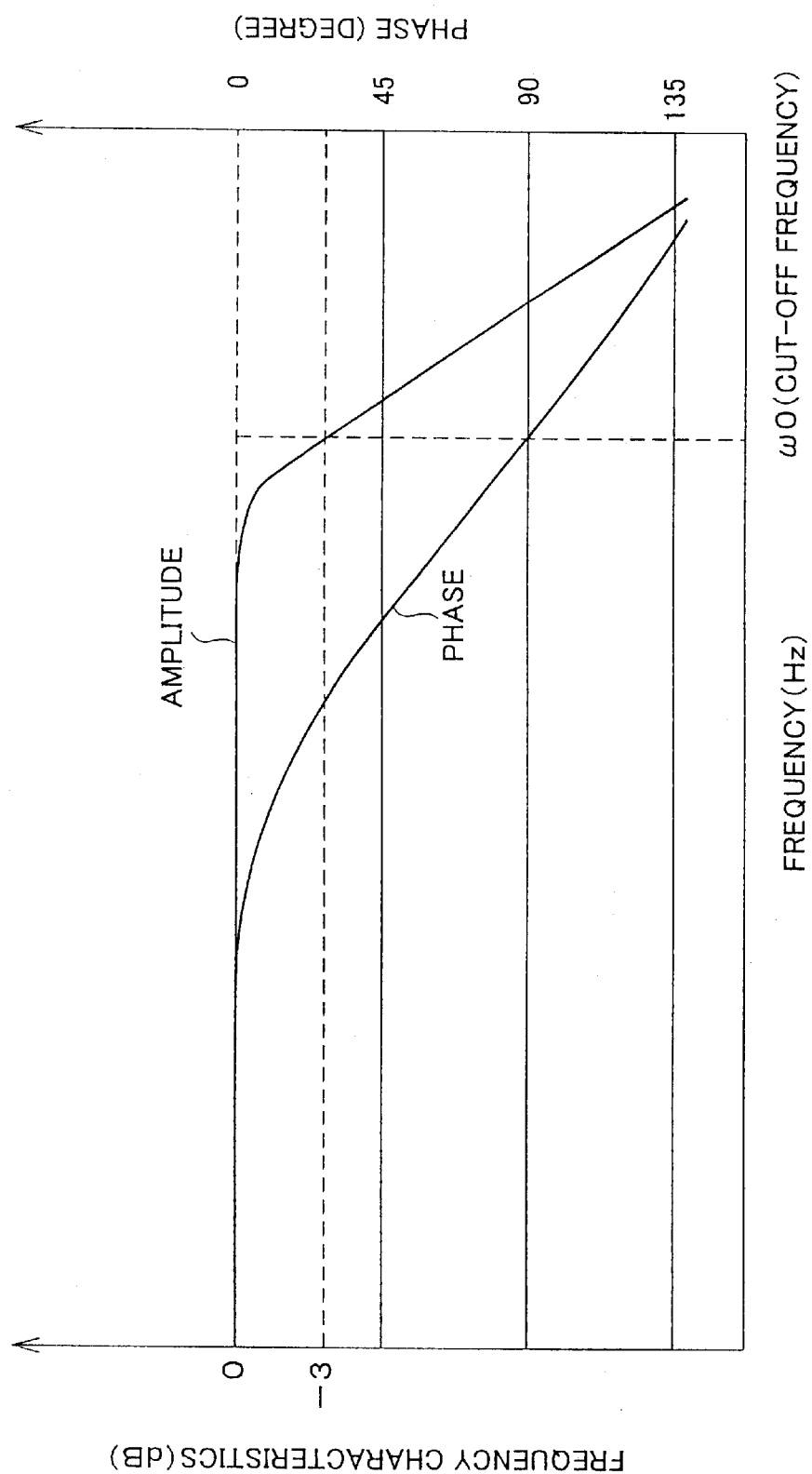
FIG. 13 is a graph showing frequency characteristics and phase characteristics of a secondary LPF.
Figure 14:
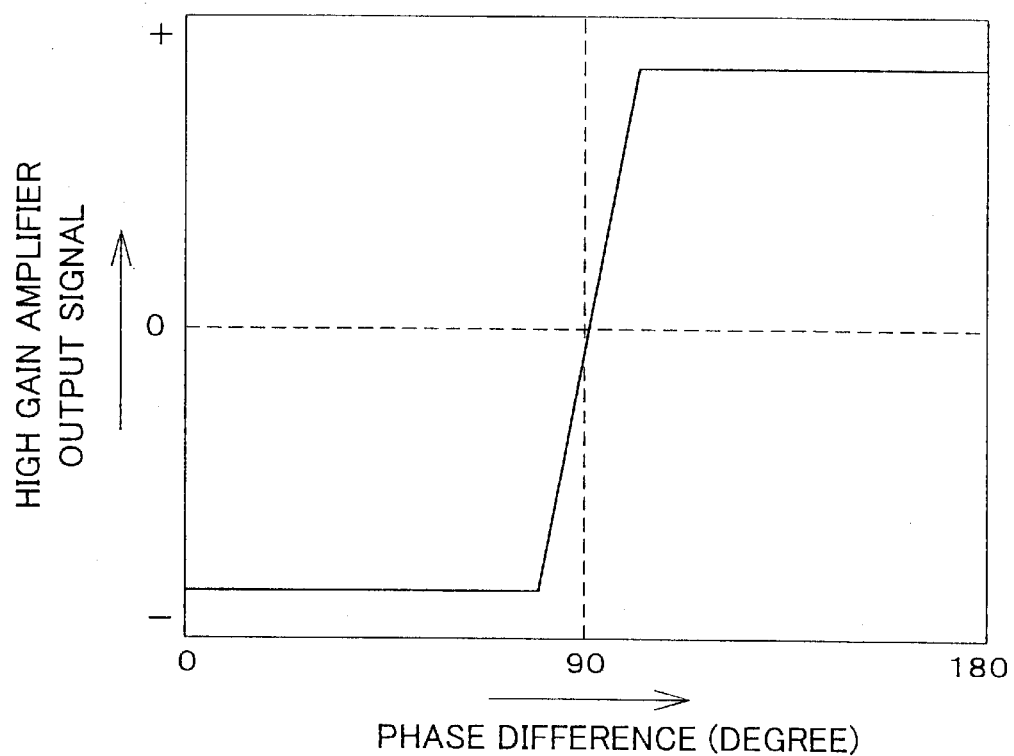
FIG. 14 is a graph explaining output characteristics of a high gain voltage amplifier.

The LPF F2, which is a secondary LPF as described above, has a 90° phase difference between an input signal and an output signal thereof, with respect to a cut-off frequency ω at which frequency characteristics are lowered by −3 dB, as shown in FIG. 13 discussed previously. Meanwhile, an output voltage of the high gain voltage amplifier 37, which amplifies the output level of the phase comparator 36, is 0V when the phase difference is 90°, as shown in FIG. 14 discussed previously. In a vicinity of 90°, the output voltage of the high gain voltage amplifier 37 is significantly varied in response to a subtle change in the phase difference.

An output of the A/D converter 38 is fed back into the micro controller 24. The micro controller 24 adjusts a digital value, which corresponds to the reference current I0 to be outputted to the D/A converter 25, in such a manner that the output thus fed back has a value (feed back value) with which the phase difference between the input signal and the output signal with respect to the LPF F2 corresponds to 90°, in other words, in such a manner that the cut-off frequencies and the reference frequency signals have the same frequency. This gives data for compensating the unevenness as to the circuit layouts of the integrated circuit, and for setting the LPF F2 to a desired cut-off frequency. The data that includes second compensating values is stored in a data memory 39.

The data memory 39 may be provided externally via a communication terminal P2, as indicated by the reference mark 39a. Moreover, the data memory 41 may overtake the function of the data memory 39 (the data memory 41 may have both the functions of the data memory 39 and of the data memory 41 itself). The data memory 41 is provided to an external CPU 40 that communicates with the micro controller 24 via a communication terminal P3, in order to switch over the adjusting mode and the regular operation mode, in order to specify, in the regular operation mode, the cut-off frequency that corresponds to the reception channel, and so as to carry out the like operation. Furthermore, the function of the data memory 39 may be overtaken by an internal memory of the micro controller 24 (the internal memory may have both the functions of the data memory 39 and of the internal memory itself) as indicated by the reference mark 39b.

The data memory 39 (39a, 41, 39b) stores first compensating values therein, together with the thus acquired data for compensating the unevenness as to the circuit layouts. The first compensating values are values that compensate shifts in the cut-off frequencies due to a dynamic change in circuit characteristics caused by a change in the power supply voltage of the LPFs F1 and F2 and/or a change in the ambient temperatures. The dynamic change of this kind is conventionally detected by a specially provided arrangement, like the reference LPF F2a, for detecting the shift in the cut-off frequencies. It is possible to simulate, in advance and with accuracy, the change in the circuit characteristics caused by the change in the power supply voltage and/or the change in the ambient temperature. Therefore, a manufacture thereof works out (determines) the change in advance, so that the data memory 39 (39a, 41, and 39b) will store therein the first compensating values that are respectively for the power supply voltages and the ambient temperatures.

Therefore, when the LPF circuit 21 is in the adjusting mode, the D/A converting apparatus 25 converts, directly into an analog voltage value, the digital value converted by the A/D converting apparatus 38. On the other hand, when the LPF circuit 21 is in the regular operation mode, the micro controller 24 reads, out of the data memory 39 (39a, 41, 39b), the date including the second compensating value that corresponds to the desired cut-off frequency. Then, the first compensating value is further read out of the data memory 39 (39a, 41, 39b), in accordance with the power supply voltage detected by a voltage detector 42, and/or the ambient temperature detected by a temperature sensor 43. The data including the second compensating value, after compensated in accordance with the first compensating value, is converted into an analog voltage value by the D/A converter 25.

The data memory 39 stores therein first compensating values that respectively correspond to a plurality of different power supply voltages, one to one. Meanwhile, the data memory 39 stores therein first compensating values that respectively correspond to a plurality of different ambient temperatures, one to one.

Note that the voltage detector 42 and the temperature sensor 43 may be externally provided outside the integrated circuit, as indicated by the reference marks 42a and 43a. In this arrangement, a detection result of the voltage detector 42 and that of the temperature sensor 43 may be inputted into the micro controller 24, directly or via the CPU 40 as shown in FIG. 1.

Figure 2:
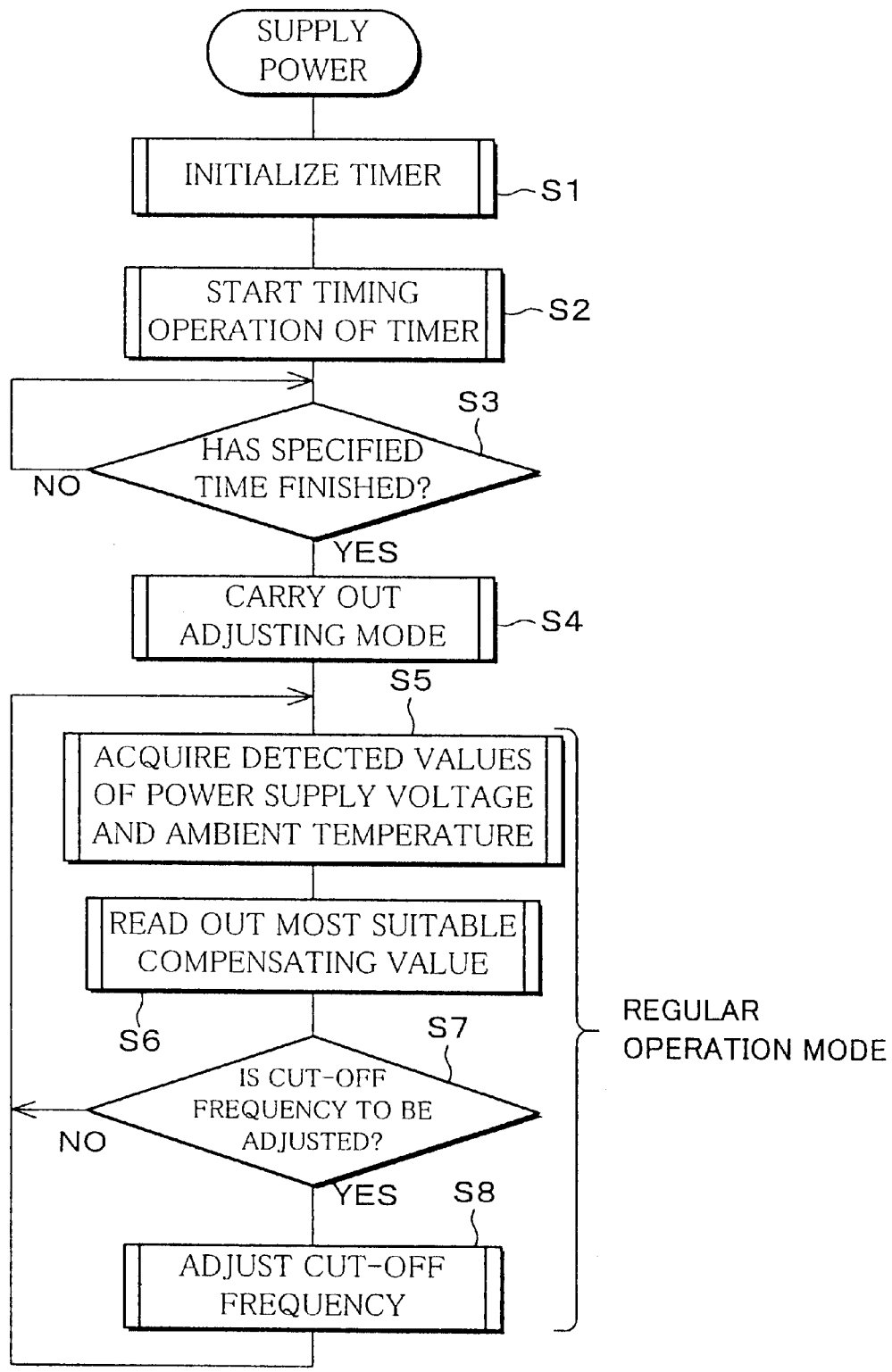
FIG. 2 is a flow chart explaining how the LPF circuit shown in FIG. 1 operates.

FIG. 2 is a flow chart explaining how the LPF circuit 21 having the above arrangement operates. FIG. 2 starts from when a power supply is turned on.

Because the circuit unstably operates right after the power supply is turned on, a delay process is carried out so as to delay start of the adjusting mode for a specified time period, by using a timer. Specifically, the timer is initialized at Step S1, and is started timing at Step S2. Step S3 is for waiting until an end of the specified time period. When the specified time period is ended, the process moves to Step S4, so as to carry out the adjusting mode later described. When the adjusting mode is ended, the mode is switched to the regular operation mode, moving to Step S5 and the following steps.

In the regular operation mode, the detection results of the voltage detector 42 and the temperature sensor 43 are entered at Step S5 firstly. Then at Step S6, a first compensating value, whose conditions (the power supply voltage and the ambient temperature) are closest to the detection results, is acquired from the data memory 39 (39a, 41, 39b) in which the conditions are stored. In case of the voltage detector 42a and the temperature sensor 43a externally provided, the detection results are acquired from the CPU 40 via the communication terminal P3, at Step S5.

Next at Step S7, judged is whether or not there is a request (1) for the adjustment of the cut-off frequency in accordance with the change of the reception channel, the request (1) being from the CPU 40, or a request (2) for the adjustment of the cut-off frequency in accordance with a change in the ambient temperature and/or a change in the power supply voltage. Here, in case there is no request for the adjustment, the process goes back to Step S5. In case a request for the adjustment is made, the process goes to Step 8 so that the adjustment is carried out.

Specifically, the adjustment of the cut-off frequency is carried out in the two methods, as described previously.

In one of the methods, the micro controller 24 changes the cut-off frequency selection signals S1 and S2, in case the change in the reception channel changes a band of the base band signal to be passed through. Then, the cut-off frequency selection signals S1 and S2 are used to control the selective switching-over of the switches SW1 to SW4 in the current value converting circuits B1 and B2, thereby adjusting the cut-off frequencies.

In the other method, in order to carry out subtle adjustment in accordance with a change in the ambient temperature and/or a change in the power supply voltage, the micro controller 24 compensates the data, in accordance with the first compensating value that corresponds to the detected ambient temperature and/or the power supply voltage, the data including the second compensating value stored in the date memory 39, and compensating the unevenness as to the circuit layout. Then the micro controller 24 outputs the thus compensated data (compensated value). The compensated value is converted to analog by the D/A converter 25, and outputted from the voltage-current converting circuit 26 as the adjusted reference current I0. The cut-off frequencies are adjusted in accordance with the adjusted reference current I0.

In case of the use of the data memory 39a or the data memory 41 externally provided, the micro controller 24 acquires the data including the second compensating value, and the first compensating value via the communication terminals P2 and P3, at Step S8.

Figure 3:
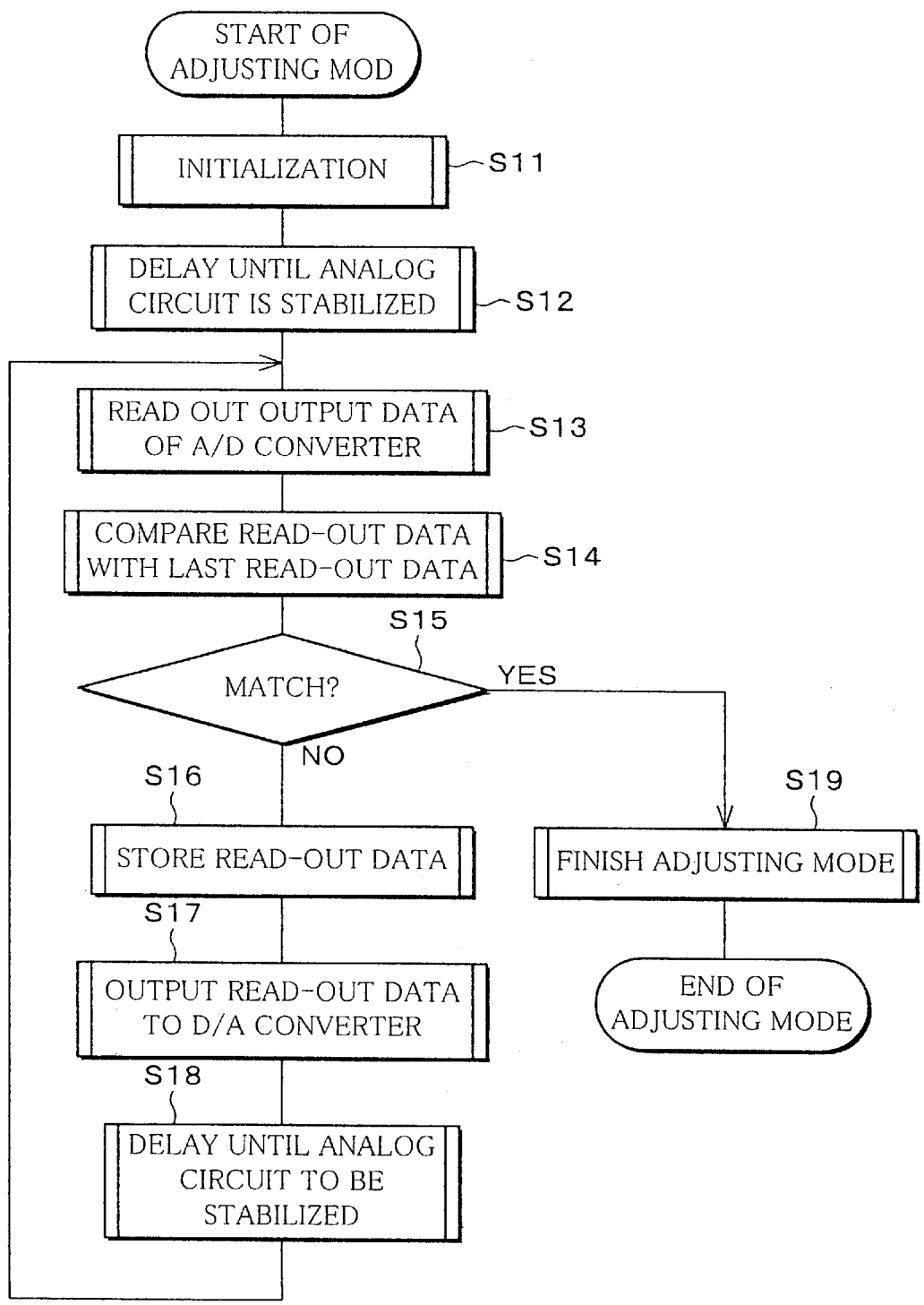
FIG. 3 is a flow chart explaining how a process is carried out in an adjusting mode.

FIG. 3 is a flow chart explaining how a process is carried out in the adjusting mode.

At Step S11, initialization is carried out. The initialization includes (a) initialization of the data memory 39 (39a, 39b), (b) setting of an initial value as to the D/A converter 25, (c) turning ON power sources or the input amplifier 33 and the block 35, (d) switching the input switching circuit 31 over so as to receive a reference frequency signal, (e) switching over the cut-off frequency selection signals S1 and S2 so as to switch the current value converting circuits B1 and B2 over to be in the adjusting mode, and the like operation.

The analog circuit operates unstably right after the initial data is supplied at the end of the initialization. Therefore, at Step S12, the process is delayed for a time period until the analog circuit gets stable. In case the data memory 41 that is used via the CPU 40 is used, the micro controller 24, via the communication terminal P3, (a) acquires data necessary for the adjusting mode (b) acquires an address in the data memory 41, the address being for storing the data therein, and further (c) causes the CPU 40 to delete the contents in the address, at Step S11.

Next at Step S13, read out from the A/D converter 38 is a digital value that represents, in terms of voltage, the phase difference between the input and output of the LPF F2 with respect to the reference frequency signal. At Step S14, the digital value is compared with a last read-out value with respect to the digital value, the last read-out value being stored in the data memory 39. In case the two values are not match with each other according to a result of the comparison, the process moves from Step S15 to Step S16, and the read-out value is stored in the data memory 39 (39a, 39b) as a new value. Then, the read-out value is set in the D/A converter 25, at Step S17. Thereafter, at Step S18, the process is delayed for a time period shorter than that of Step S12 until the analog circuit is stabilized again. The time period is shorter than that of Step S12 because the analog circuit is got unstable only due to the change in the data as to the D/A converter 25. Then, the process moves back to Step S13 for comparing the phase difference.

As to the result of the comparison, an absolute value of a comparing value (a value to be compared) is compared with an error range value, in case a certain error range is acceptable. If the value thus acquired in the comparison is smaller than the error range value, the adjustment may be finished. Note that there is no last read-out value for the comparison at Step S14 that is performed straight after Step S11. In this case, the process unconditionally moves to Step S15. After repeating Steps S13 to S18 several times, when the result of comparison of Step S14 showed that the digital value and the last read-out value match with each other, the process moves from Step S15 to Step S19, so as to carry out termination of the adjusting mode.

The termination of the adjusting mode includes (a) turning OFF the input amplifier 33 and the block 35, (b) switching the input switching circuit 31 over so as to receive the output from the LPF F1. In case the data memory that is used via the CPU 40 is used, the micro controller 24, at Step S19, transmits the data that was outputted to the D/A converter 25, and the data of the ambient temperature and/or the power supply voltage, to the CPU 40 via the communication terminal P3, so that those data will be stored in the data memory 41.

When the adjusting mode is ended (terminated), a value that is lastly outputted from the A/D converter 38 is set in the D/A converter 25, and the reference current I0 is initialized. When the ambient temperature and/or the power supply voltage is changed thereafter, the reference current I0 is compensated each time in accordance with the first compensating value, which is read out from the data memory 39 (39a, 41, 39b) in accordance with the change.

During the adjusting mode period, this arrangement determines the reference current I0 including the second compensating value that corresponds to the relative unevenness, which is invariable value while each integrated circuit is different due to the circuit layout. Meanwhile, in this arrangement, the manufacturer works out the first compensating value in advance with high accuracy via simulation, the first compensating value corresponding to the ambient temperature and power supply voltage, which are dynamically changed during usage. The first compensating value is stored in the data memory 39, 39a, 41, or the like. The reference current I0 is compensated in accordance with the first compensating value, in this arrangement.

This makes it possible to accurately control the cut-off frequencies of the LPFs F1 and F2. Moreover, there is no possibility that the filter output or a reference frequency signal reaches to the following base band amplifier while the LPF circuit 21 is in the regular operation mode, because the adjustment is carried out by the LPFs F1 and F2 themselves to which the base band signal is inputted. Therefore, no special consideration as to the circuit arrangement and wiring is required, thereby shortening a time for layout. The provision of the adjusting mode gives no or little problem to the set top box for digital satellite broadcasting, which is seldom turned ON and OFF, once it is turned ON.

Figure 10:
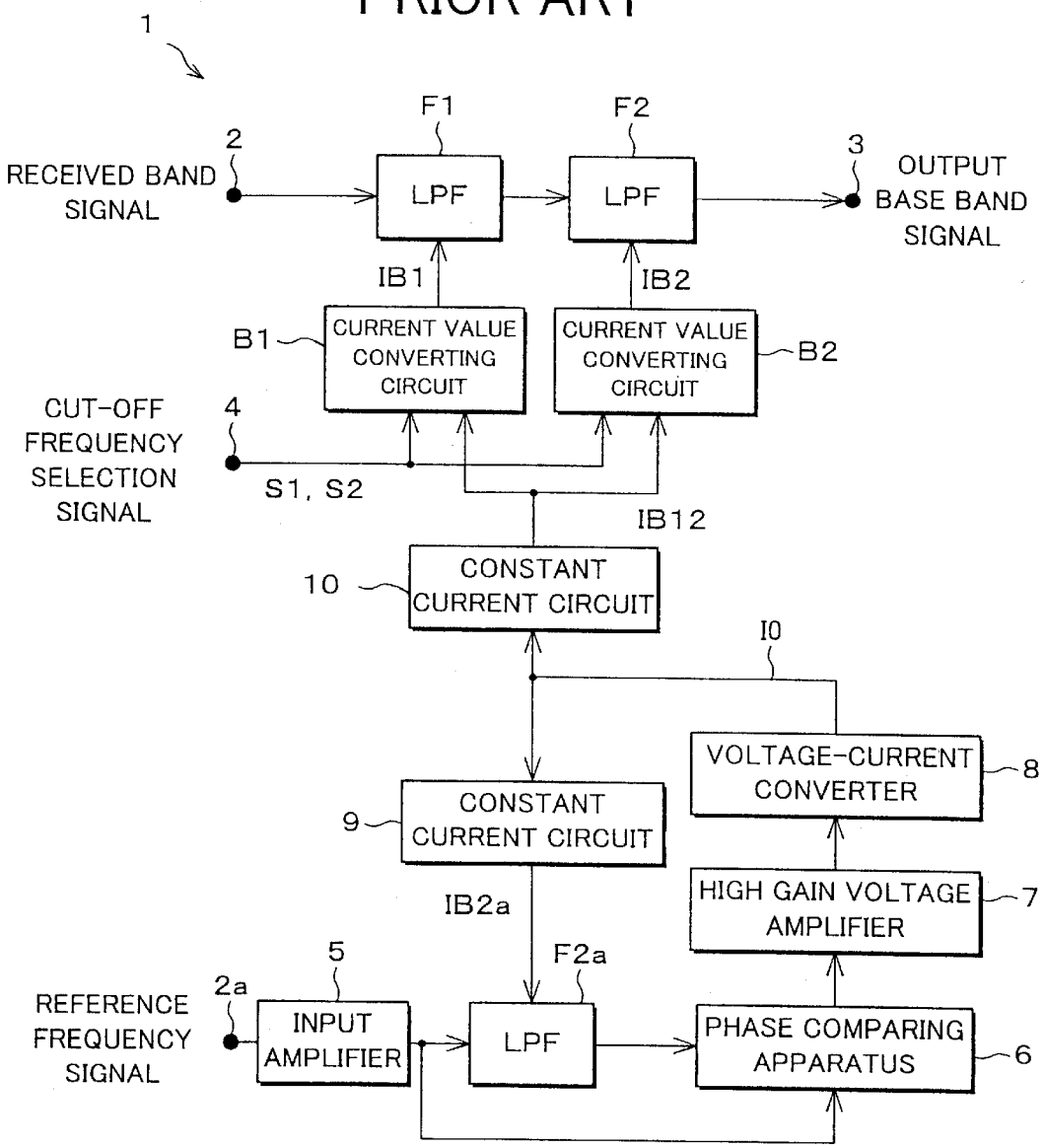
FIG. 10 is a block diagram illustrating an electrical arrangement of a typical conventional LPF circuit.
Figure 11:
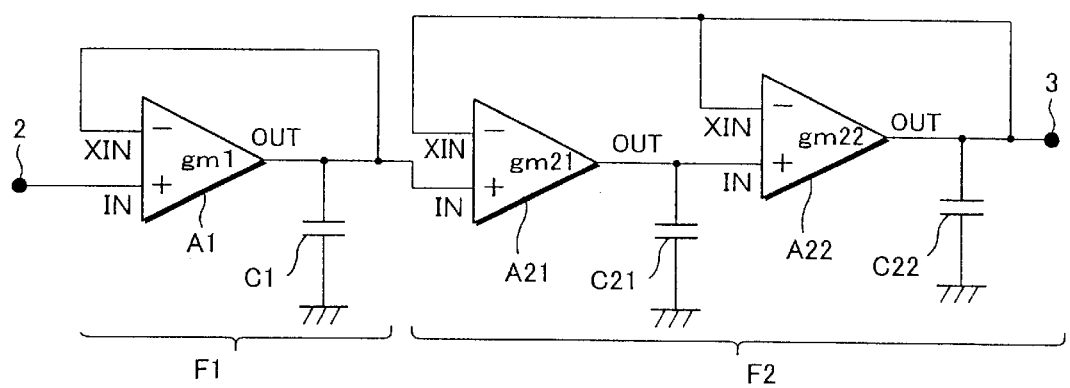
FIG. 11 is a block diagram specifically illustrating an LPF, of which the LPF circuits of the embodiments of the present invention and the LPF circuit shown in FIG. 10 are constituted.
Figure 12:
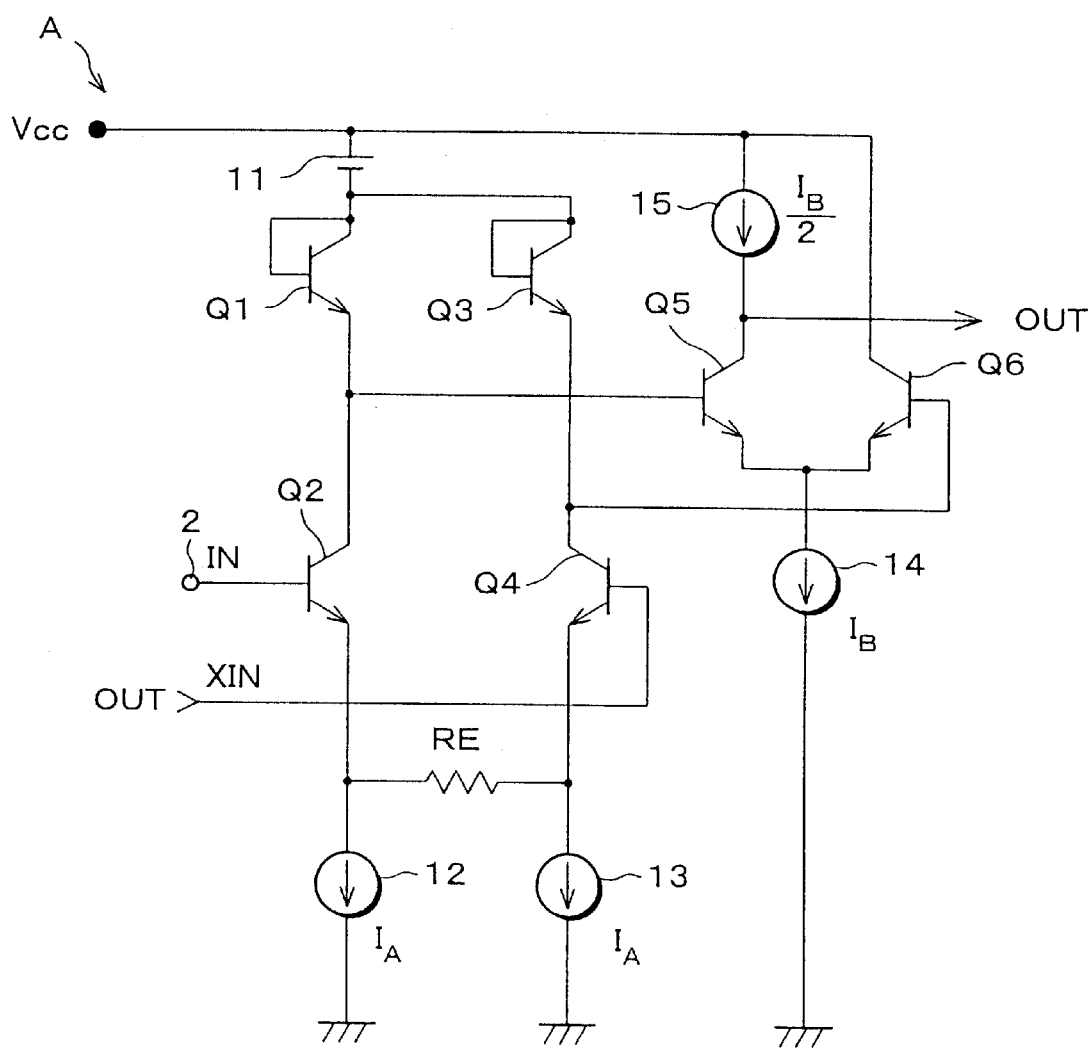
FIG. 12 is an electrical circuit diagram of one of gm amplifiers that constitute the LPF shown in FIG. 11.

Note that the LPFs F1 and F2 are identically constituted in terms of the circuit arrangement and layout, except the arrangement for adjusting the cut-off frequencies. This gives an advantage as to the relative unevenness. Therefore, the identity of the circuits makes it possible to adjust the cut-off frequencies with high accuracy by adjusting the reference current IB1 in accordance with the reference current IB2. However, it is disadvantageous in terms of area to have the reference LPF F2a having the same arrangement and layout as the LPFs F1 and F2 of the main body, as an LPF circuit 1 shown in FIG. 10. Moreover, it is a problem that there is an error between the constant current sources 9 and 10 that supply the reference currents IB2a and IB12.

Moreover, the characteristics of the LPFs F1 and F2 are so adjusted that the LPFs F1 and F2 will have a plurality of cut-off frequencies, and that each cut-off frequency will be in accordance with integral multiple of the reference currents IB1 and IB2. Therefore, the use of the current mirror as the current value converting circuits B1 and B2 enables easy adjustment of the cut-off frequencies. Furthermore, the block 35, which includes the phase comparator 36, stops operating while the LPF circuit 21 is in the regular operation mode, thereby further reducing electrical power consumption.

Explained below is another embodiment of the present invention, referring to FIGS. 4 and 5.

Figure 4:
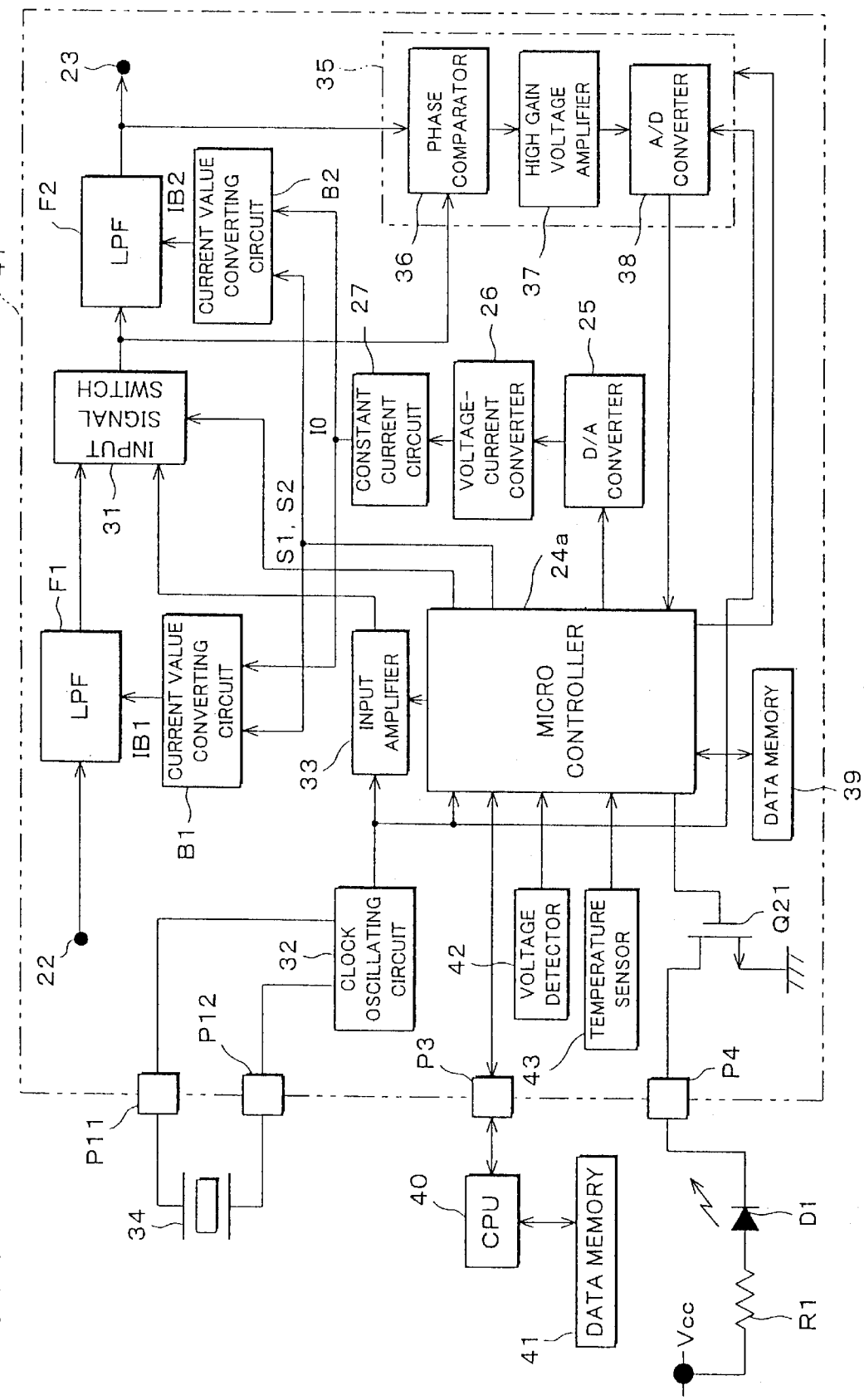
FIG. 4 is a block diagram showing an electrical arrangement of an LPF circuit of another embodiment of the present invention.

FIG. 4 is a block diagram illustrating an electrical arrangement of an LPF circuit 41 of the another embodiment of the present invention. Since the LPF circuit 41 is similar to the LPF circuit 21, its corresponding members are labeled in the same way and their explanation is omitted here.

It is described above that the cut-off frequencies can be adjusted by switching over the two modes, namely, the adjusting mode and the regular operation mode. However, in actual integrated circuits, in case identical circuits are integrated on a wafer of semiconductor, it is impossible to manufacture the integrated circuits without a defective product. Therefore, it is necessary to have a test for inspecting the integrated circuit as to whether or not it operates normally. The test as to the unevenness of the cut-off frequencies is time consuming. Thus, to test each integrated circuit one by one leads to a longer period for testing, thereby increasing a cost of the integrated circuit. In view of this, it should be noted that the LPF circuit 41 provides an arrangement with which all the LPF circuits are spontaneously tested, without a special testing apparatus.

As described above, a micro controller 24a is connected with an external CPU 40 via a communication terminal P3. Moreover, the micro controller 24a is connected so that the micro controller 24 can control turning ON and OFF an FET Q21 of Nch open drain. A drain terminal of the FET Q21 is connected with an output terminal P4. The output terminal P4 is connected with a cathode of a light-emitting diode D1. An anode of the light-emitting diode D1 is connected with a power supply voltage Vcc via a current limiting resistance R1. Therefore, the cathode of the light-emitting diode D1 has a GND potential, when the micro controller 24a outputs such a gate voltage that turns ON between the drain and the source. Thereby, the light-emitting diode is lit on.

Figure 5:
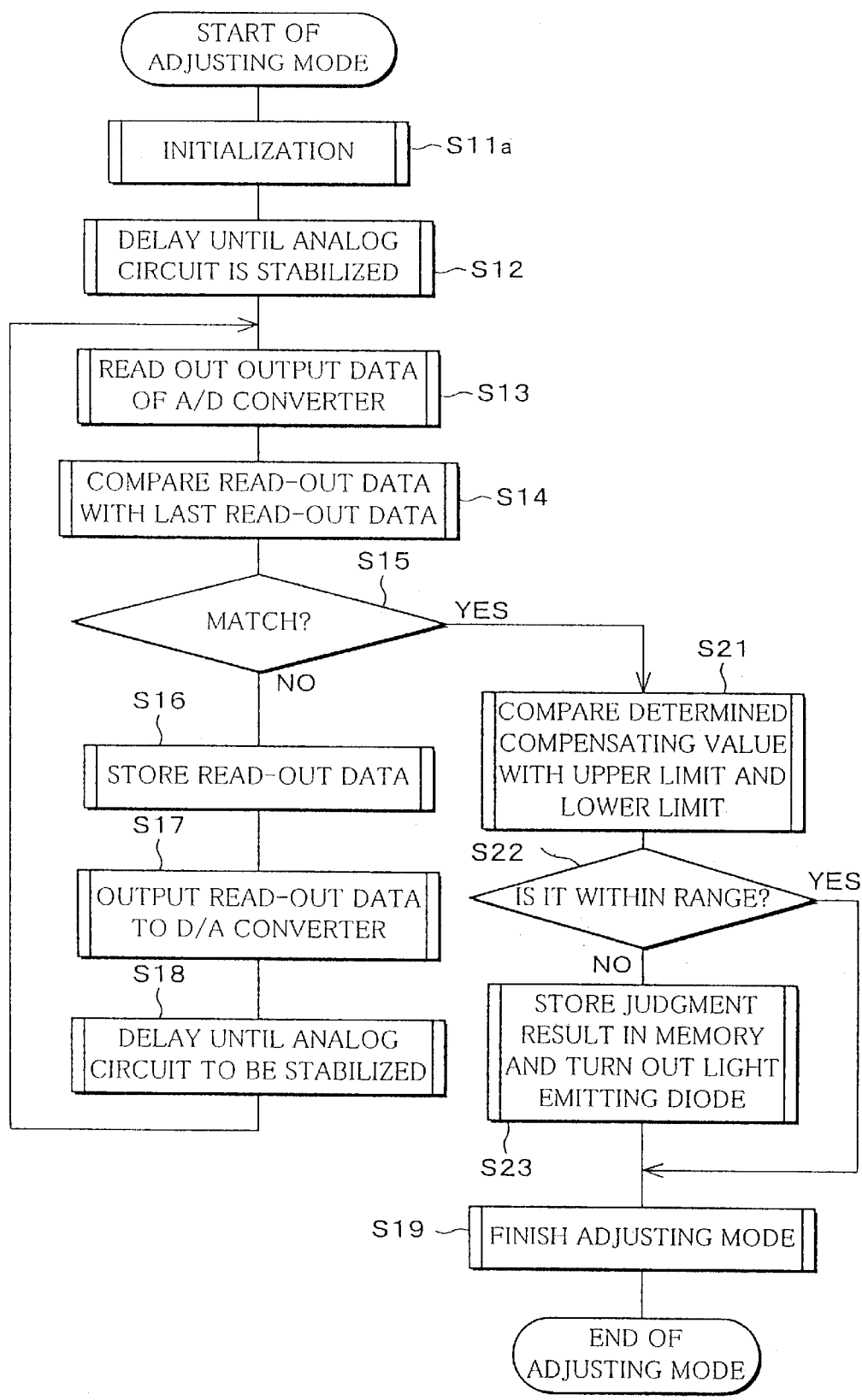
FIG. 5 is a flow chart explaining how a process is carried out when the LPF circuit shown in FIG. 4 is in an adjusting mode.

FIG. 5 is a flow chart explaining how a process is carried out when the above-mentioned LPF circuit 41 is in the adjusting mode.

An initializing process of Step 11a includes (a) initializing a data memory 39, (b) setting an initial value for a D/A converter 25, (c) turning ON an input amplifier 33 and a block 35, (d) switching an input switching circuit 31 over so as to receive a reference frequency signal, (e) switching over cut-off frequency selection signals S1 and S2 so as to switch over current value converting circuits B1 and B2 into the adjusting mode, (f) acquiring, from a CPU 40, various data necessary for the adjusting mode, (g) acquiring an address in a data memory 41, and deleting a content of the address, and the like operation. Moreover, in the initializing process, an upper limit value and a lower limit value are acquired to be references for judgment in the test. The upper and lower limit values are set in a data memory 39.

Thereafter, a compensating value is determined by repeating the process from Step S12 to Step S18. Then at Step S21, the determined compensating value is compared with the upper and lower limit values that are set at Step S11a. Thereby, at Step S22, judged is whether or not the compensating value is within a range between the upper and the lower limit values. If the compensating value is within the range, the process moves to Step S19 for terminating the adjusting mode. On the other hand, if the compensating value is not within the range between the upper and lower limit values, the process moves to Step S23 for storing a result of the judgment in the data memory 39 and turning ON the FET Q21. This causes the output terminal P4 to have a GND level, so as to light on the light-emitting diode D1. In this manner, notified to an outside is that the product is a defect. Thereafter, the process moves to Step S19 for terminating the adjusting mode.

The adjusting mode of this arrangement needs no special testing apparatus, but uses such a testing apparatus that a single CPU 40 for external control controls a plurality of integrated circuits in switching-over manner. With this arrangement, it is possible to carry out the cut-off frequency adjustment with respect to the unevenness as to the circuit layouts for a large number of the integrated circuits, simultaneously. Furthermore, at the same time, the integrated circuits are tested and selected as to whether they are non-defective or defective.

A still another embodiment of the present invention is described below, referring to FIGS. 6 to 9.

Figure 6:
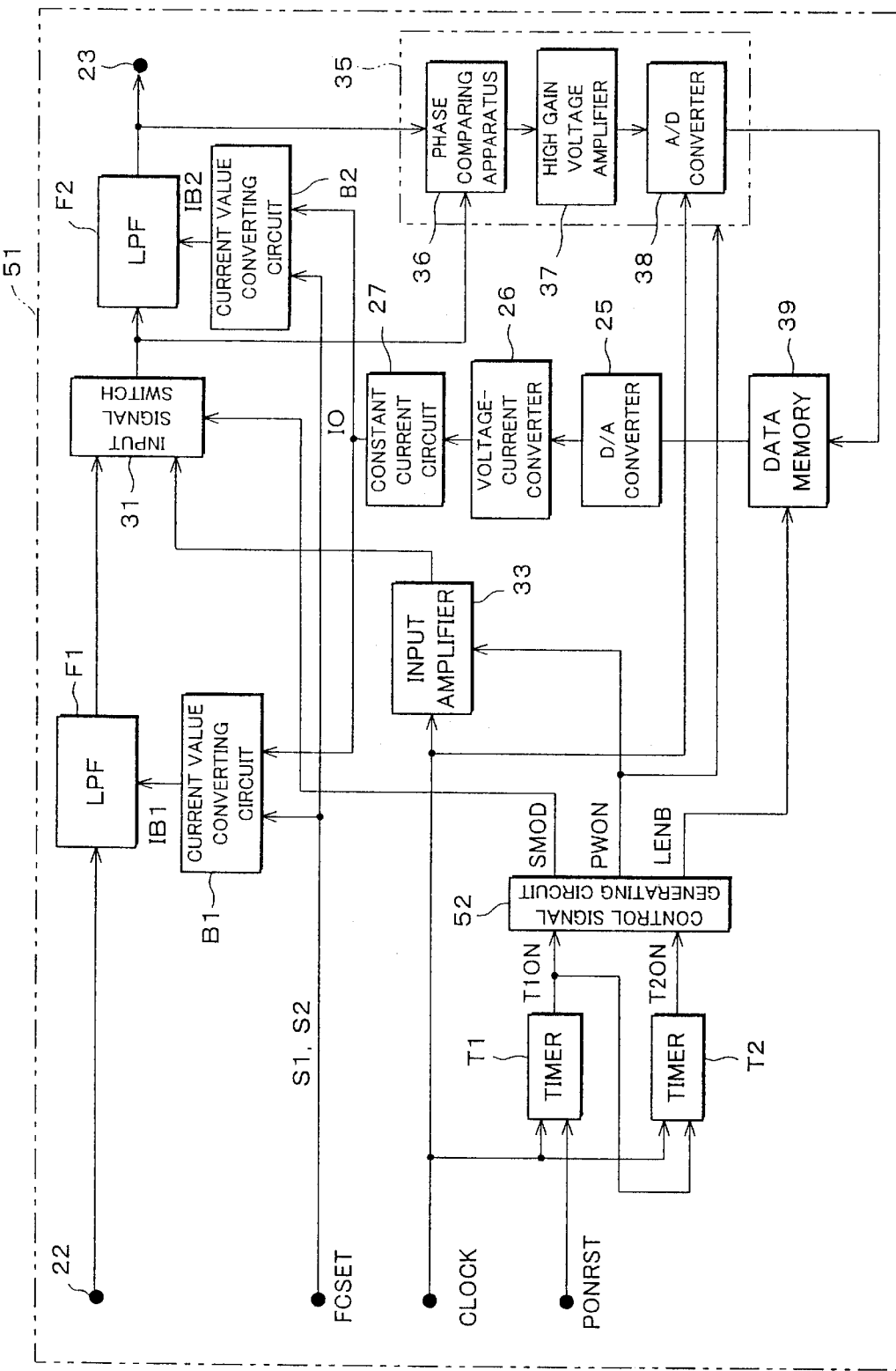
FIG. 6 is a block diagram illustrating an electrical arrangement of an LPF circuit of a still another embodiment of the present invention.

FIG. 6 is a block diagram illustrating an electrical arrangement of an LPF circuit 51 of the still another embodiment of the present invention.

The LPF circuit 51 is similar to the LPF circuits 21 and 41, previously described. Thus, its corresponding members are labeled in the same way, and their explanation is omitted here. The LPF circuits 21 and 41 require the micro controllers 24 and 24a no matter the LPF circuits 21 and 41 are in the adjusting mode or regular operation mode. However, direct conversion integrated circuits for the digital satellite broadcasting reception are generally provided with a frequency control PLL (phase locked loop) circuit of a demodulation local oscillator. Thus, the direct conversion integrated circuits are generally provided with communication means for external communication in order to set frequencies. Here, it should be noted that the LPF circuit 51 externally receives the data for the adjustment of the cut-off frequency by utilizing the communication means, for performing the adjustment of the cut-off frequency by using the two timers T1 and T2.

The timer T1 times a stabilizing period of an analog circuit after a power is supplied, whereas the timer T2 measures a required period for an adjusting mode. The timers T1 and T2 receive a clock signal CLOCK via the communication means (not shown). Moreover, the timer T1 receives a power-on-reset signal PONRST that indicates that a power is supplied. In timer T1, timing operation of the clock signal CLOCK is started at a time when the power-on-reset signal PONRST is activated. On the other hand, the Timer T2 receives a counting output T1ON of the timer T1. In timer T2, timing operation of the clock signal CLOCK is started at a time when the counting output T1ON is activated.

The counting output T1ON of the timer T1 and a counting output T2ON of the timer T2 are inputted into a control signal generating circuit 52. The control signal generating circuit 53 generates (a) a switching control signal SMOD for an input switching circuit 31, (b) a power control signal PWON for controlling power supply of an input amplifier 33 and block 35 that operate only during an adjusting mode period, and (c) a latch signal LENB. The latch signal LENB causes a digital value of an A/D converter 38 to be stored in the data memory 39 right after an end of the adjusting mode.

Figure 7:
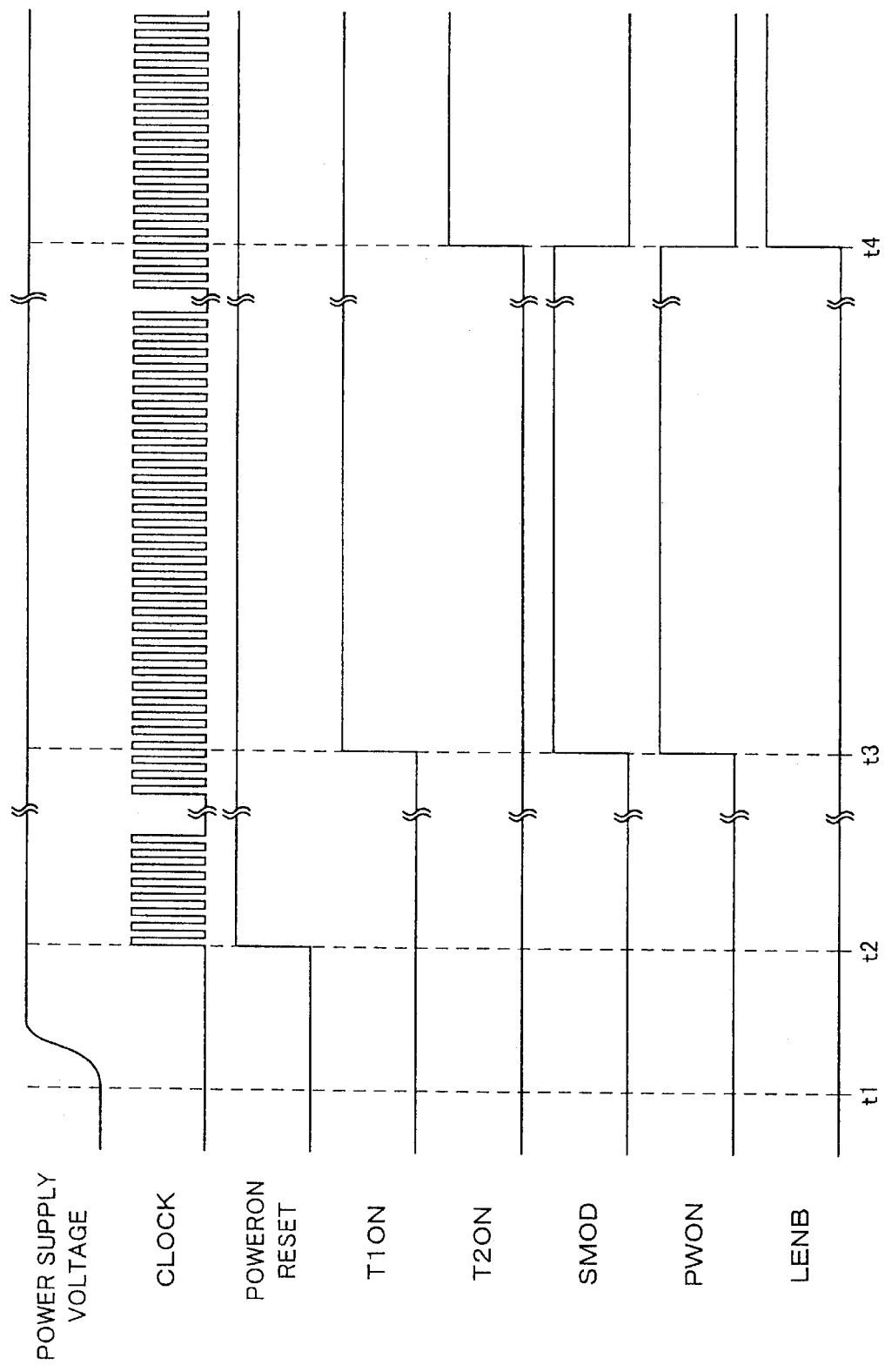
FIG. 7 is a waveform chart showing timing of generation of each signal of the LPF circuit shown in FIG. 6.

FIG. 7 is a waveform diagram illustrating timing for the generation of each signal. A power is supplied at Time t1, so that power supply voltage is increased, then the power-on-reset signal PONRST is activated at Time t2, and supply of the clock signal CLOCK is started. At this time, the timer Ti starts timing operation. At Time t3, the timer T1 finishes timing of stabilizing period of the analog circuit. Then, the switching control signal SMOD is activated so as to switch over the input switching circuit 31 to an input amplifier 33, and the power control signal PWON is activated so as to start supplying the power to the block 35. In this manner, the adjusting mode is started and the timer T2 starts the timing operation.

The date memory 39 outputs an intact digital value of the A/D converter 38 to a D/A converter 25, while the latch signal LENB is not active and at a low level. Moreover, the date memory 39 holds the intact digital value of the A/D converter 38, when the timer T2 finishes the timing operation of the required time of the adjusting mode at Time t4, and the latch signal LENB is activated and is at a high level. Here, the switching control signal SMOD is inactivated so as to switch over the input switching circuit 31 to an LPF F1, meanwhile the power control PWON is inactivated so as to stop supplying the power to the block 35.

Figure 8:
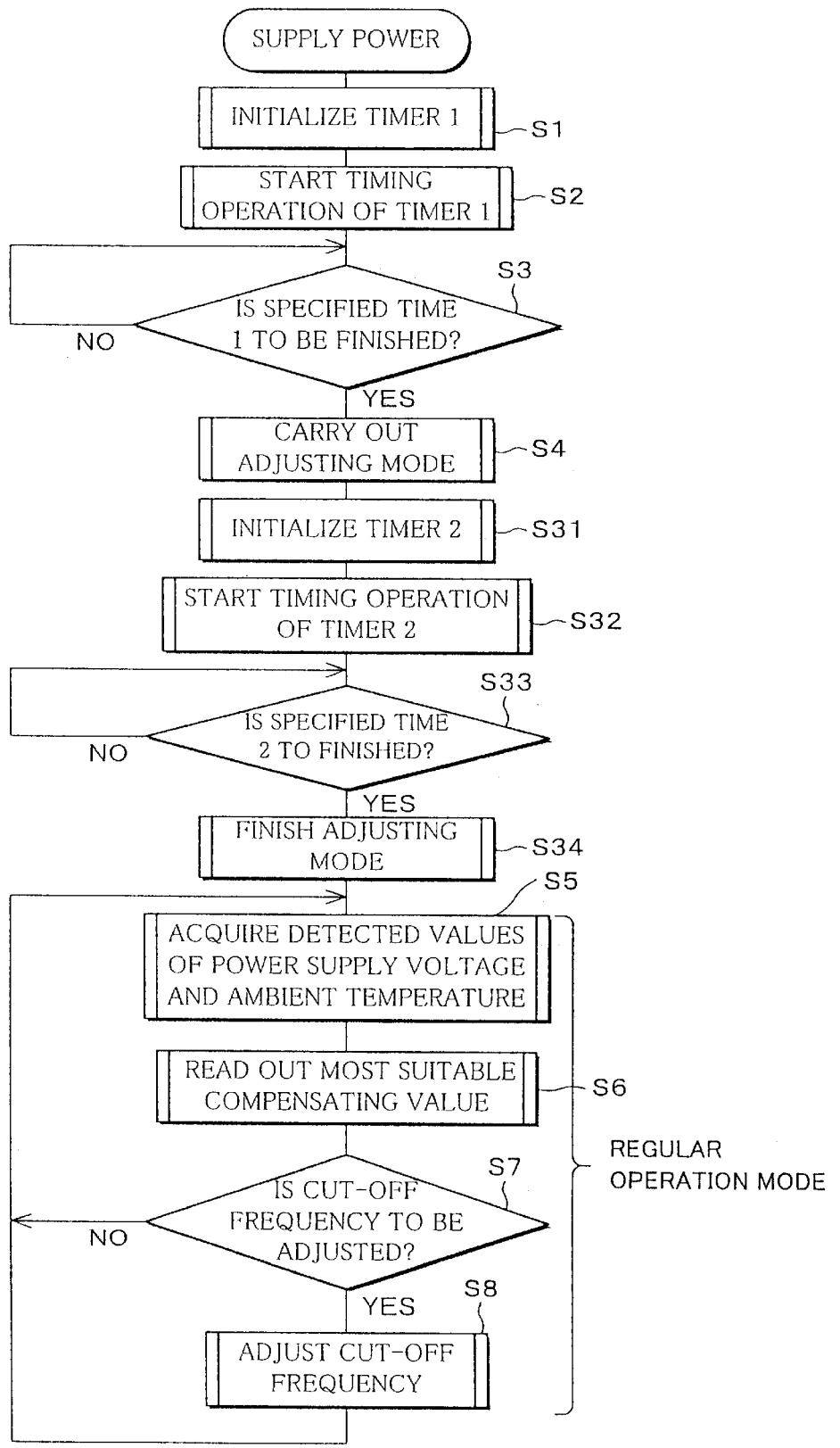
FIG. 8 is a flow chart explaining how the LPF circuit shown in FIG. 6 operates.

FIG. 8 is a flow chart explaining how the LPF circuit 51 having the above arrangement operates. Steps that correspond to those in previously described FIG. 2 are labeled in the same way. At Step S1, the timer T1 is initialized. From Step S2, the timer T1 starts the timing operation. At Step S3, a specified time of the timer T1 is finished. Then at Step S4, the adjusting mode is started. At Step S31, the timer T2 is initialized. At Step S32, the timer T2 starts timing. At Step S33, a specified time for the timer T2 is ended. Then at Step S34, the adjusting mode is finished. Thereafter, the mode is switched back to the regular operation mode, moving to Step S5 and the following steps.

Figure 9:
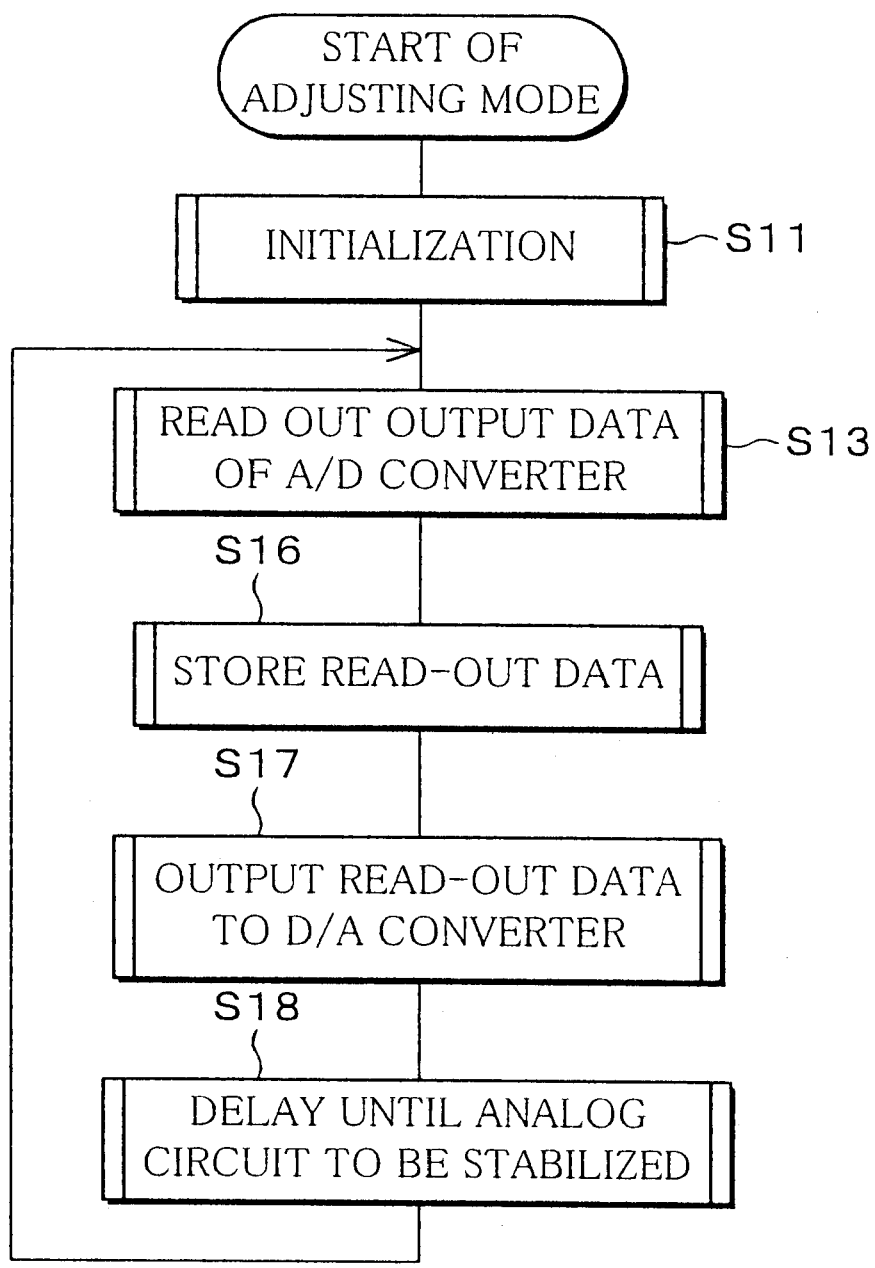
FIG. 9 is a flow chart explaining how the LPF circuit shown in FIG. 6 operates when the LPF circuit is in an adjusting mode.

As described above, the digital value of the A/D converter 38 is acquired when the specified time for the timer T2 is finished. Thereby, as shown in FIG. 9, Steps S13, S16, S17 and S18 are simply repeated in the adjusting mode, so as to update the digital value continuously.

The use of the timers T1 and T2 in this way realizes, by using a simple circuit arrangement, an adjusting process in which the adjusting mode is automatically operated when the power is supplied. Therefore, it is possible to provide an integrated circuit apparatus having an adjusted cut-off frequency, by using no expensive adjusting apparatus such as a laser-processing machine.

Note that the data memories, 39, 39a, 39a, and 41 may be non-volatile memories so that the adjusted values once acquired by the adjusting mode can be held even after the power supply is shut off. This reduces a number of adjusting for the built-in data memories 39, 39a, and 39b, which are adjusted only during the production thereof. Moreover, even for the externally provided data memory 41, it is possible to eliminate the adjusting by acquiring the data during the production thereof so as to set the data in the present integrated circuit.

A variable frequency filter circuit of the present embodiments, including adjusting means in regard to a filter, the adjusting means arbitrarily selecting a cut-off frequency in accordance with a selection signal (a setting value) that is supplied from control means, the variable frequency filter circuit is provided with (a) first recording means for storing therein a first compensating value for compensating the selection signal, the selection signal being worked out in advance via simulation in order to compensate circuit characteristics that dynamically vary depending on usage, (b) a reference signal source, (c) input switching means, provided in an input stage of the filter, for inputting, to the filter, the reference frequency signal instead of an input signal, during an adjusting mode period during which the adjusting means adjusts the cut-off frequency, (d) the control means for adjusting the selection signal so that an output from the filter with respect to the reference frequency signal will have a predetermined value, and (e) second recording means for storing the adjusted selection signal as a second compensating value, wherein during a regular operation mode period the control means compensates a shift in the cut-off frequency due to a change in the circuit characteristics by compensating the selection signal with the first compensating value stored in the first recording means, and compensates a shift in the cut-off frequency due to a circuit layout by compensating the second compensating value stored in the second recording means.

This eliminates an effect of the arrangement for adjusting the cut-off frequency, a need of special consideration for the circuit layout and wiring, thereby reducing a time for layout.

Moreover, in the variable frequency filter circuit, a value of the selection signal is selected in accordance with sequential integral multiplication, and characteristics of the cut-off frequency of the filter is so adjusted as to be sequentially integral multiple, corresponding to the selection signal.

In the above arrangement, the circuit elements are laid out so that the cut-off frequency of the filter, which is determined by the value of the thus adjusted selection signal, will be varied in proportion to integral multiple of the value of the selection signal. With this, when the selection signal is represented by a current value, the current value can be the integral multiple easily by using the current mirror circuit. Thereby, the cut-off frequency can be adjusted easily.

Furthermore, the variable frequency filter circuit of the present embodiments, the control means stops the phase comparator operating during the regular operation mode period, the phase comparator working out an amount of the shift in the cut-off frequency from a phase difference between an input and an output of the filter.

In the above arrangement, the first compensating value, which is used for compensating the shift of the cut-off frequency due to the circuit characteristics that dynamically changes as the usage in accordance with the power supply voltage, the ambient temperature or the like, is worked out in advance and with accuracy, and stored in the first recording means. Thus, all the control means has to do is to read out the first compensating value from the first recording means and pass it to the adjusting means, if the power supply voltage, the ambient temperature or the like is changed. This eliminates a need of detecting a result of the compensation. Therefore, the phase comparator is stopped operating during the regular operation mode period.

Thereby, electrical power consumption is reduced.

Moreover, the variable frequency filter circuit of the present embodiments is further provided with judging means for judging whether or not the second compensating value is within a predetermined range of a normal value, the second compensating value being stored in the second recording means, and notifying means for notifying to an outside a result of the judging by the judging means.

According to the above arrangement, it may be so adopted that an upper limit and a lower limit of a value of the selection signal for the adjusting mode are stored as fixed values in advance in the integrated circuit, or that the upper and lower limits are externally inputted via communication and set in the judging means. Thereby, at an end of automatic adjustment for determining the second compensating value, judged is whether or not the second compensating value is within the range of the normal value. The result of the judgment is notified to the outside.

Therefore, the adjustment improves a yield of the process, and reduces the period for testing, with no special inspection apparatus, and spontaneously inspecting a plurality of integral circuits.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A variable frequency filter circuit, comprising:
   a filter for adjusting a cut-off frequency;
   adjusting means for arbitrarily setting the cut-off frequency of the filter in accordance with a variable setting value so at to adjust the cut-off frequency;
   first recording means for storing therein a first compensating value for compensating the setting value, the compensating value being worked out in advance via simulation in order to compensate circuit characteristics that dynamically vary depending on usage;
   a reference signal source for generating a reference frequency signal;
   input switching means, provided in an input stage of the filter, for inputting, to the filter, the reference frequency signal instead of an input signal, during an adjusting mode period during which the adjusting means adjusts the cut-off frequency;
   control means for adjusting the setting value so that an output from the filter with respect to the reference frequency signal will have a predetermined value, and for outputting the setting value; and
   second recording means for storing the adjusted setting value as a second compensating value,
   wherein during a regular operation mode period the control means compensates a shift in the cut-off frequency due to a change in the circuit characteristics by compensating the setting value with the first compensating value stored in the first recording means, and compensates a shift in the cut-off frequency due to a circuit layout by compensating the setting value with the second compensating value stored in the second recording means.

2. The variable frequency filter circuit as set forth in claim 1, wherein:
   the control means compensates the second compensating value in accordance with the first compensating value so as to compensate the setting value.

3. The variable frequency filter circuit as set forth in claim 1, wherein:
   the adjusting means adjusts the cut-off frequency so that the cut-off frequency is sequentially integral multiple, corresponding to the setting value selected in a manner of sequential integral multiplication.

4. A variable frequency filter circuit as set froth in claim 1, further comprising:
   a phase comparator for working out an amount of the shift in the cut-off frequency from a phase difference between an input and the output of the filter in the adjusting mode period,
   wherein the control means, in the adjusting mode period, adjusts the setting value in accordance with an output value of the phase comparator, whereas the control means, in the regular operation mode period, stops the phase comparator operating.

5. A variable frequency filter circuit as set forth in claim 1, further comprising:
   judging means for judging whether or not the second compensating value is within a predetermined range of a normal value, the second compensating value being stored in the second recording means; and
   notifying means for notifying to an outside, a result of the judging by the judging means.

6. An integrated circuit comprising:
   a variable frequency filter circuit integrated in the integrated circuit, the variable frequency filter circuit including:
   a filter for adjusting a cut-off frequency;
   adjusting means for arbitrarily setting the cut-off frequency of the filter in accordance with a variable setting value so at to adjust the cut-off frequency;
   first recording means for storing therein a first compensating value for compensating the setting value, the compensating value being worked out in advance via simulation in order to compensate circuit characteristics that dynamically vary depending on usage;
   a reference signal source for generating a reference frequency signal;
   input switching means, provided in an input stage of the filter, for inputting, to the filter, the reference frequency signal instead of an input signal, during an adjusting mode period during which the adjusting means adjusts the cut-off frequency;
   control means for adjusting the setting value so that an output from the filter with respect to the reference frequency signal will have a predetermined value, and for outputting the setting value; and
   second recording means for storing the adjusted setting value as a second compensating value,
   wherein during a regular operation mode period the control means compensates a shift in the cut-off frequency due to a change in the circuit characteristics by compensating the setting value with the first compensating value stored in the first recording means, and compensates a shift in the cut-off frequency due to a circuit layout by compensating the setting value with the second compensating value stored in the second recording means.

7. The integrated circuit as set forth in claim 6, wherein:
   the control means compensates the second compensating value in accordance with the first compensating value so as to compensate the setting value.

8. The integrated circuit as set forth in claim 6, wherein:
   the adjusting means adjusts the cut-off frequency so that the cut-off frequency is sequentially integral multiple, corresponding to the setting value selected in a manner of sequential integral multiplication.

9. An integrated circuit as set froth in claim 6, further comprising:
   a phase comparator for working out an amount of the shift in the cut-off frequency from a phase difference between an input and the output of the filter in the adjusting mode period,
   wherein the control means, in the adjusting mode period, adjusts the setting value in accordance with an output value of the phase comparator, whereas the control means, in the regular operation mode period, stops the phase comparator operating.

10. An integrated circuit as set forth in claim 6, further comprising:

judging means for judging whether or not the second compensating value is within a predetermined range of a normal value, the second compensating value being stored in the second recording means; and notifying means for notifying to an outside, a result of the judging by the judging means.

11. An integrated circuit as set forth in claim 6, further comprising:

voltage detection means for detecting a power supply voltage of the integrated circuit, wherein the first recording means reads out the first compensating value that corresponds to the power supply voltage thus detected by the voltage detection means, and wherein the control means compensates the setting value in accordance with the first compensating value thus read out.

12. An integrated circuit as set forth in claim 6, further comprising:

temperature detection means for detecting an ambient temperature of the integrated circuit, wherein the first recording means reads out the first compensating value that corresponds to the ambient temperature thus detected by the temperature detection means, and wherein the control means compensates the setting value in accordance with the first compensating value thus read out.

* * * * *